US006859056B2

United States Patent
Bai et al.

(10) Patent No.: US 6,859,056 B2
(45) Date of Patent: Feb. 22, 2005

(54) TEST FIXTURE FOR SEMICONDUCTOR PACKAGE AND TEST METHOD OF USING THE SAME

(75) Inventors: Jin-Chuan Bai, Hsinchu (TW); Huan-Ping Su, Hsinchu (TW); Soon-Aik Lu, Hsinchu (TW)

(73) Assignee: UltraTera Corporation (TW)

( * ) Notice: Subject to any disclaimer, the term of this patent is extended or adjusted under 35 U.S.C. 154(b) by 0 days.

(21) Appl. No.: 10/176,147

(22) Filed: Jun. 20, 2002

(65) Prior Publication Data

US 2003/0151420 A1 Aug. 14, 2003

(30) Foreign Application Priority Data

Feb. 8, 2002 (TW) ........................................ 91102516 A (51) Int. Cl.⁷ ............................................... G01R 31/02
(52) U.S. Cl. ....................................................... 324/755
(58) Field of Search .............................. 324/754–755, 324/758, 761, 765; 439/66, 70–71, 74

(56) References Cited

U.S. PATENT DOCUMENTS

| | | | | |
|---|---|---|---|---|
| 5,702,255 A | * | 12/1997 | Murphy et al. ............... 439/71 |
| 5,932,891 A | * | 8/1999 | Higashi et al. ............... 324/755 |
| 5,955,888 A | * | 9/1999 | Frederickson et al. ....... 324/755 |
| 6,018,249 A | * | 1/2000 | Akram et al. ................ 324/758 |
| 6,193,524 B1 | * | 2/2001 | Chang .......................... 439/66 |
| 6,218,849 B1 | * | 4/2001 | Kiyokawa .................... 324/755 |
| 6,229,320 B1 | * | 5/2001 | Haseyama et al. .......... 324/755 |
| 6,292,003 B1 | * | 9/2001 | Fredrickson et al. ........ 324/755 |
| 6,344,684 B1 | * | 2/2002 | Hussain et al. .............. 324/755 |
| 6,400,169 B1 | * | 6/2002 | Hembree ..................... 324/755 |
| 6,503,089 B2 | * | 1/2003 | Saijo et al. .................... 439/70 |

* cited by examiner

*Primary Examiner*—David Zarneke
*Assistant Examiner*—Jermele Hollington
(74) *Attorney, Agent, or Firm*—Peter F. Corless; Steven M. Jensen; Edwards & Angell, LLP (57) ABSTRACT

A test fixture for semiconductor packages and a test method of using the test fixture are proposed. The test fixture is composed of a circuit board, an interposer and a covering member. The circuit board is used to accommodate semiconductor packages and electrically connect the semiconductor packages to a test device. The interposer is mounted on the circuit board, and formed with through holes for receiving the semiconductor packages therein. The covering member is attached onto the interposer, and provided with elastic mechanisms for holding the semiconductor packages in position. By using the test fixture, semiconductor packages can be firmly coupled to the test device where functional tests are performed.

12 Claims, 7 Drawing Sheets

TEST FIXTURE FOR SEMICONDUCTOR PACKAGE AND TEST METHOD OF USING THE SAME

FIELD OF THE INVENTION

The present invention relates to test fixtures for semiconductor packages and test methods of using the test fixtures, and more particularly, to a test fixture for use with BGA (ball grid array) semiconductor packages, and a method for testing the semiconductor packages through the use of the test fixture.

BACKGROUND OF THE INVENTION

Conventionally, fabricated semiconductor packages are required to be performed with various functional tests, such as direct current test, burn-in test, room/cold test, hot sort test, etc; these tests are used to test functionality of the semiconductor packages, for selecting good-quality packages and eliminating inferior products, thereby assuring yield of package fabrication. The direct current test is to detect the occurrence of electrical failure in assembly of semiconductor packages. The burn-in test allows semiconductor packages to undergo extreme environmental conditions such as high temperature, so as to determine if early failure would occur in practical operation of the semiconductor packages. During the room/cold test, semiconductor packages are treated with room temperate (about 25° C.) or low temperature (about 0° C.), for testing functional impairment of the semiconductor packages. The hot sort test is performed under a high temperature environment of around 80° C., so as to examine electricity or functionality and determine operational speed of semiconductor packages. Since the above functional tests are all conventional in the art, they are not to be further described herein.

Figure 1A:
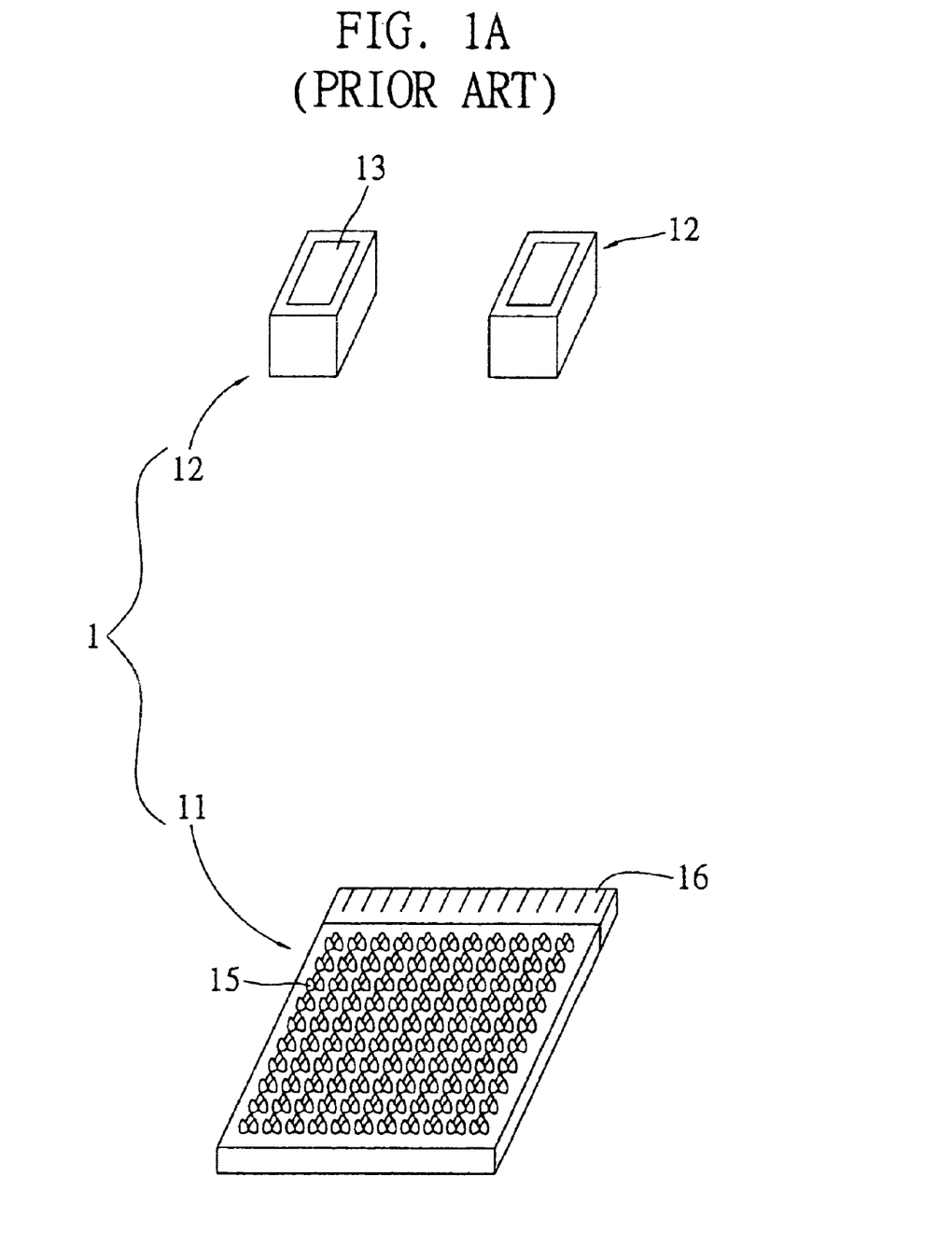
FIG. 1A (PRIOR ART) is a perspective view of a conventional test fixture.
Figure 1B:
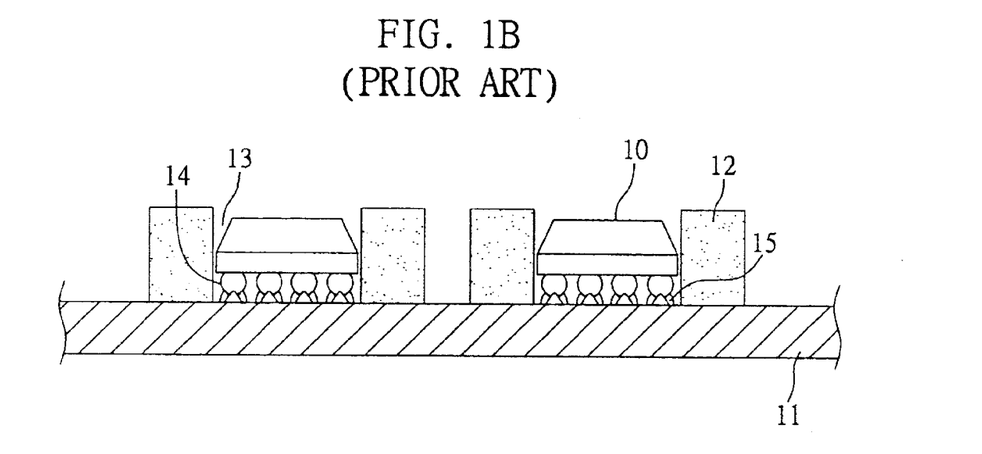
FIG. 1B (PRIOR ART) is a cross-sectional view of the conventional test fixture of FIG. 1A mounted with semiconductor packages.

For performing the foregoing tests, semiconductor packages need to be electrically connected by a test fixture to a test device e.g. an oven where various temperature or electricity conditions for package testing are conducted. FIGS. 1A and 1B illustrate a conventional test fixture 1, which is used to accommodate BGA (ball grid array) semiconductor packages 10 and electrically connect the semiconductor packages 10 to a test device (not shown) for performing functional tests. As shown in the drawings, the test fixture 1 comprises a circuit board 11 and a plurality of sockets 12 coupled to the circuit board 11. Each socket 12 is a multi-layer structure (normally eight layers), and formed with a fixed-sized through hole 13, allowing the semiconductor package 10 to be received in the through hole 13. Conventionally, about 150 to 300 sockets 12 are mounted on the circuit board 11, and thus, the test fixture 1 can simultaneously accommodate around 150 to 300 semiconductor packages 10 that are intended to undergo functional tests. When the sockets 12 accompanied with the semiconductor packages 10 are disposed on the circuit board 11, the semiconductor packages 10 are allowed to be electrically connected via solder balls 14 to contact terminals 15 formed on the circuit board 11. Then, the circuit board 11 can be coupled to the test device, by which the semiconductor packages 10 are electrically connected to the test device where multiple tests are performed for testing functionality of the semiconductor packages 10. For coupling the circuit board 11 to the test device, for example, the test device can be formed with a socket that is engaged with an input/output (I/O) terminal 16 of the circuit board 11; since this coupling technology is conventional in the art, no further description thereto is to be here detailed.

However, the above conventional test fixture has significant drawbacks. First, a socket used for accommodating a semiconductor package therein is structured with multiple layers, and fabricated by costly and complex processes. And, the socket is formed with a fixed-sized through hole for receiving the semiconductor package; therefore, multiple types of sockets formed with through holes of different dimensions are necessarily fabricated for use with variously sized semiconductor packages. With around 150 to 300 sockets being utilized for each test fixture, it needs to manufacture a plenty of expensive and complicated sockets, and thus greatly increases fabrication costs and process complexity for the test fixture. Moreover, in response to profile miniaturization of semiconductor packages, old sockets designed for use with large packages are out of date and probably have to be discarded, farther making fabrication costs and material waste undesirably increased.

Therefore, how to develop a test fixture applicable for variously sized semiconductor packages, and to allow the test fixture to be cost-effectively fabricated by simplified processes, is a critical subject to investigate herein.

SUMMARY OF THE INVENTION

An objective of the present invention is to provide a test fixture for semiconductor packages and a test method of using the test fixture, wherein the test fixture uses a replaceable interposer and a covering member with elastic mechanisms for firmly holding BGA (ball grid array) semiconductor packages in position, without having to use conventional costly and structurally complex sockets, thereby making the test fixture relatively more cost-effectively fabricated by simplified processes.

Another objective of the invention is to provide a test fixture for semiconductor packages and a test method of using the test fixture, wherein the test fixture can be applied to variously sized semiconductor packages by simply replacing an interposer with suitably dimensioned through holes for properly receiving the semiconductor packages.

A further objective of the invention is to provide a test fixture for semiconductor packages and a test method of using the test fixture, wherein a covering member of the test fixture is formed with elastic mechanisms for pressing on semiconductor packages, allowing the semiconductor packages to be well electrically connected to a circuit board of the test fixture, and elastic properties of the elastic mechanisms would not damage structure of the semiconductor packages, thereby not undesirably deteriorating yield of package products.

In accordance with the above and other objectives, the present invention proposes a test fixture for semiconductor packages and a test method of using the test fixture. The test fixture is used to electrically connect a plurality of BGA (ball grid array) semiconductor packages to a test device where tests are performed.

The test fixture comprises: a circuit board for accommodating a plurality of semiconductor packages thereon, and for electrically connecting the semiconductor packages to the test device; an interposer detachably mounted on the circuit board, and formed with a plurality of through holes that penetrate through the interposer, so as to allow the semiconductor packages to be received in the through holes; and a covering member mounted on the interposer and for covering the semiconductor packages received in the through holes of the interposer, wherein the covering member is formed on a surface thereof with a plurality of elastic mechanisms corresponding in position to the through holes in a manner that, the elastic mechanisms are adapted to abut against the semiconductor packages and provide a resilient force as to allow the semiconductor packages to be firmly in contact with the circuit board.

The test method of using the above test fixture comprises the steps of: preparing a circuit board; mounting an interposer on the circuit board, the interposer being formed with a plurality of through holes that penetrate through the interposer; disposing a plurality of semiconductor packages respectively in the through holes of the interposer, allowing the semiconductor packages to be accommodated on and electrically connected to the circuit board; attaching a covering member to the interposer, for covering the semiconductor packages received in the through holes of the interposer, wherein the covering member is formed on a surface thereof with a plurality of elastic mechanisms corresponding in position to the through holes in a manner that, the elastic mechanisms are adapted to abut against the semiconductor packages and provide a resilient force as to allow the semiconductor packages to be firmly in contact with the circuit board; and electrically connecting the circuit board to the test device, so as to allow the semiconductor packages to be electrically connected to the test device where tests are performed.

The circuit board is formed with a plurality of contact mechanisms for coming into electrical contact with input/output (I/O) connections e.g. solder balls of the semiconductor packages that are accommodated on the circuit board. With the circuit, board being electrically connected to the test device, the semiconductor packages can be electrically coupled to the test device where multiple functional tests are performed for the semiconductor packages.

The interposer is dimensioned in a manner as to allow the semiconductor packages to be completely received in the through holes and held in position on the circuit board. It is a characteristic feature of the invention that, the interposer can be freely replaced in response to variably sized semiconductor packages, wherein the through holes of the interposer are flexibly formed corresponding in dimension to the semiconductor packages. Therefore, the test fixture can be applied to various semiconductor packages of different sizes through the use of an interposer with suitably dimensioned through holes, by which semiconductor packages can be comfortably received in the through holes and firmly positioned on the circuit board. Besides, as the interposer is structurally simple and fabricated in low cost, it would desirably simplify fabrication processes and reduce fabrication costs for the test fixture.

The elastic mechanisms formed on the covering member are each dimensioned in a manner as to completely cover the corresponding semiconductor package, so as to allow the semiconductor package to be evenly in contact with the circuit board by means of the resilient force provided from the elastic mechanism. Moreover, a plurality of protruding portions can be formed on a surface of the covering member corresponding in position to the elastic mechanisms in a manner that, the protruding portions are interposed between the surface of the covering member and the elastic mechanisms. By both the protruding portions and the elastic mechanisms, electrical contact between the semiconductor packages and the circuit board would be better assured.

The test fixture is greatly advantageous of using a replaceable interposer and a covering member with elastic mechanisms for firmly holding semiconductor packages in position, instead of costly and structurally complex sockets of the prior art, thereby making the test fixture more cost-effectively fabricated by simplified processes. Moreover, the elastic mechanisms formed on the covering member are used to press on semiconductor packages, allowing the semiconductor packages to be well electrically connected to a circuit board of the test fixture; and elastic properties of the elastic mechanisms would not damage structure of the semiconductor packages, thereby not undesirably deteriorating yield of package products.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

Preferred embodiments for a test fixture proposed in the present invention are described in more detail as follows with reference to FIGS. 2 and 3. The drawings only illustrate components or parts of the test fixture in simplicity; it should be understood that, these components or parts are not drawn in real sizes or numbers, and the test fixture of the invention is structurally more complex in practical fabrication.

Figure 2:
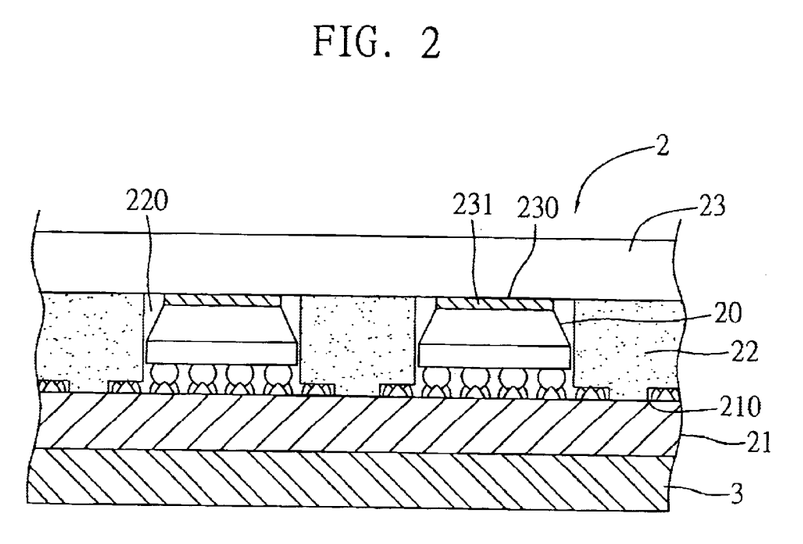
FIG. 2 is a cross-sectional view of an embodiment of a test fixture of the invention mounted with semiconductor packages.
Figure 3:
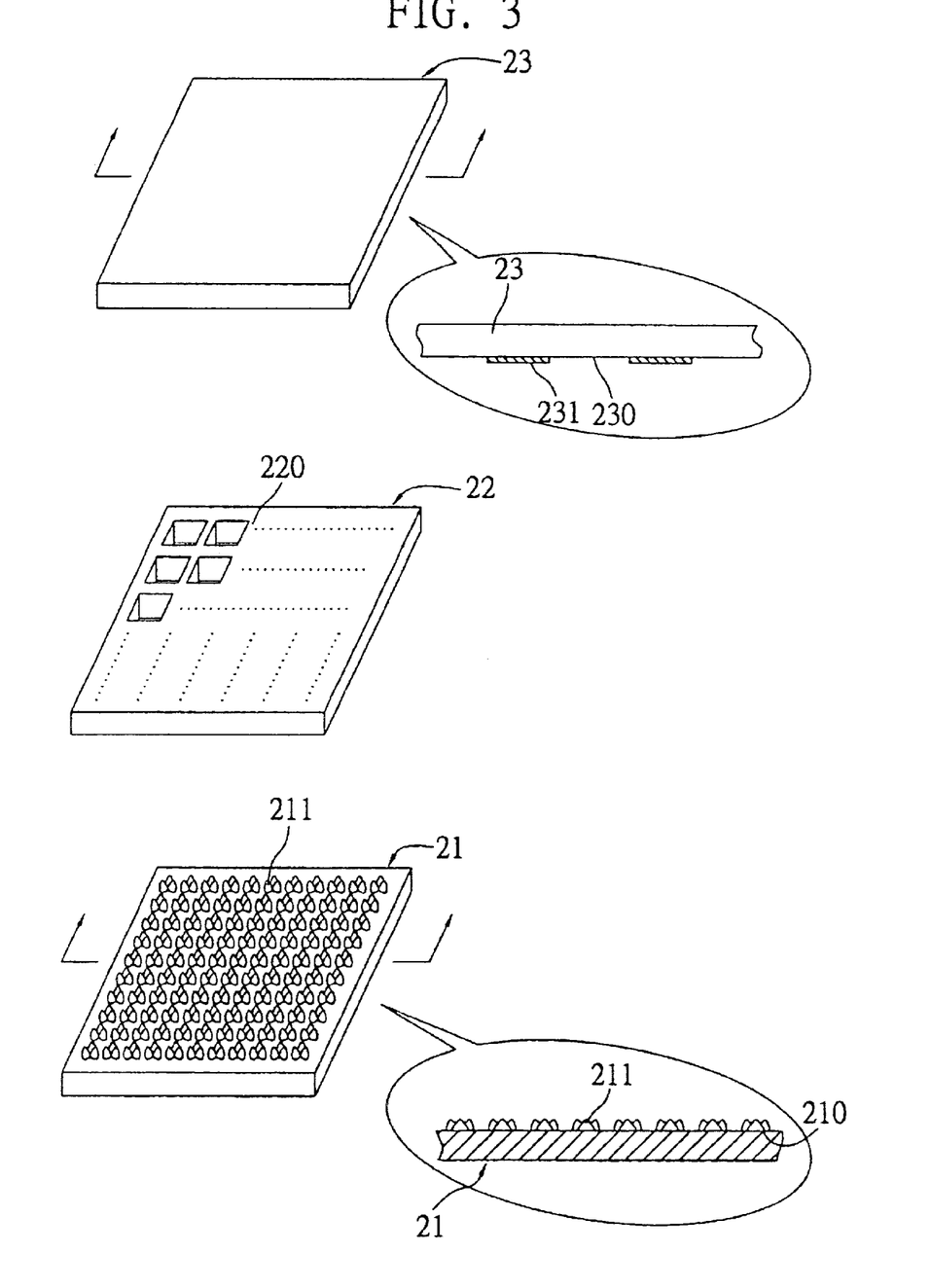
FIG. 3 is a schematic diagram showing perspective and cross-sectional view of components of the test fixture of the invention.

FIG. 2 illustrates a test fixture 2 of the invention mounted with semiconductor packages 20; FIG. 3 illustrates components of the test fixture 2 of the invention, including a circuit board 21, an interposer 22 and a covering member 23. As shown in FIG. 2, the test fixture 2 is used to electrically connect a plurality of semiconductor packages 20 e.g. BGA (ball grid array) semiconductor packages to a test device, such as a test oven 3, where functional tests are performed for the semiconductor packages 20.

The test fixture 2 comprises: a circuit board 21 for accommodating the plurality of semiconductor packages 20 thereon, and for electrically connecting the semiconductor packages 20 to the test device 3; an interposer 22 detachably mounted on the circuit board 21, and formed with a plurality of through holes 220 that penetrate through the interposer 22, so as to allow the semiconductor packages 20 to be received in the through holes 220; and a covering member 23 mounted on the interposer 22, for covering the semiconductor packages 20 received in the through holes 220 of the interposer 22, wherein the covering member 23 is formed on a surface 230 thereof with a plurality of elastic mechanisms 231 corresponding in position to the through holes 220 in a manner that, the elastic mechanisms 231 are adapted to abut against the semiconductor packages 20, and provide a resilient force as to allow the semiconductor packages 20 to be firmly in contact with the circuit board 21.

FIGS. 4A–4D illustrate process steps involved in a test method of using the test fixture 2 of the invention.

Figure 4A:
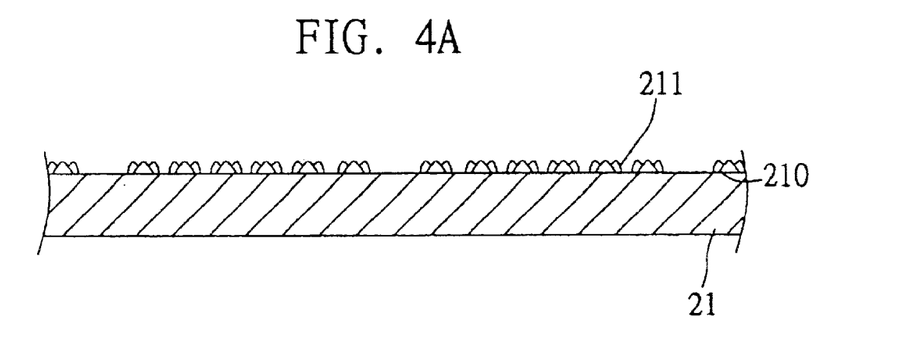
FIGS. 4A–4D are cross-sectional schematic diagrams showing process steps involved in a test method of using the test fixture of the invention.

Referring to FIG. 4A, the first step is to prepare a circuit board 21 that is formed on a surface 210 thereof with a plurality of contact mechanisms 211. The circuit board 21 is used to accommodate a plurality of semiconductor packages (not shown) that are intended to be performed with various functional tests, wherein the contact mechanisms 211 come into contact with input/output (I/O) connections e.g. solder balls of the semiconductor packages, allowing the semiconductor packages to be electrically connected to the circuit board 21. The contact mechanisms 211 can be, but not limited to, contact terminals made of an electrically conductive material; it should be understood that, other electrical connection/contact means are also suitably applied herein as the contact mechanisms 211 of the invention Referring to FIG. 4B, the next step is to detachably mount an interposer 22 on the circuit board 21. The interposer 22 is made of an insulating material and formed with a plurality of through holes 220 that penetrate through the interposer 22. The through holes 220 are used to respectively receive semiconductor packages (not shown) that are intended to be, accommodated on the circuit board 21. The through holes 220 are dimensioned in a manner that, the semiconductor packages are entirely received in the through holes 220 and held in position on the circuit board 21.

Figure 4B:
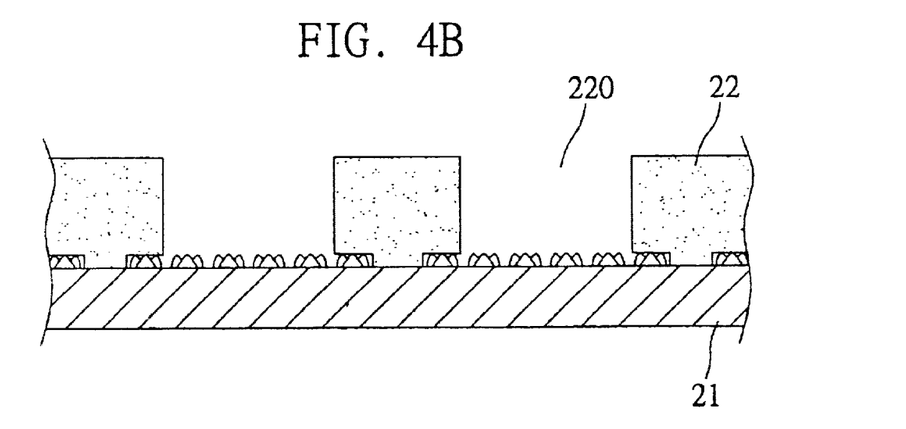

It is a characteristic feature of the invention that, the interposer 22 can be freely replaced in response to variably sized semiconductor packages, wherein the through holes 220 of the interposer 22 are flexibly formed corresponding in dimension to the semiconductor packages. Therefore, the test fixture 2 can be applied to various semiconductor packages of different sizes through the use of an interposer 22 formed with suitably dimensioned through holes 220, by which semiconductor packages can be comfortably received in the through holes 220 and firmly positioned on the circuit board 21. Besides, as the interposer 22 is structurally simple and fabricated in low cost, it would desirably decrease process complexity and costs in fabrication of the test fixture 2.

Figure 4C:
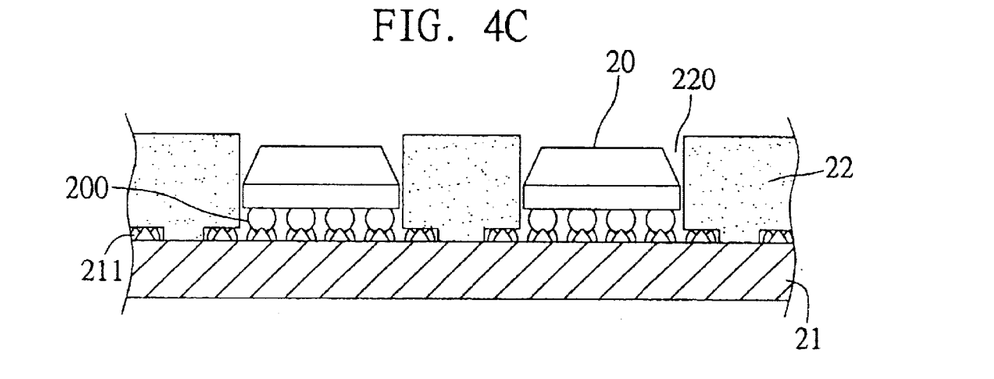

Referring to FIG. 4C, a plurality of semiconductor packages 20 e.g. BGA semiconductor packages are disposed respectively in the through holes 220 of the interposer 22 in a manner that, I/O connections 200 such as solder balls of the semiconductor packages 20 are electrically coupled to the contact mechanisms 211 of the circuit board 21. As the through holes 220 of the interposer 22 are formed correspondingly in dimension to the semiconductor packages 20, thereby the semiconductor packages 20 can be properly held in position on the circuit board 21 without being dislocated or shifted, and electrical contact with the semiconductor packages 20 and the contact mechanisms 211 would be firmly assured.

Figure 4D:
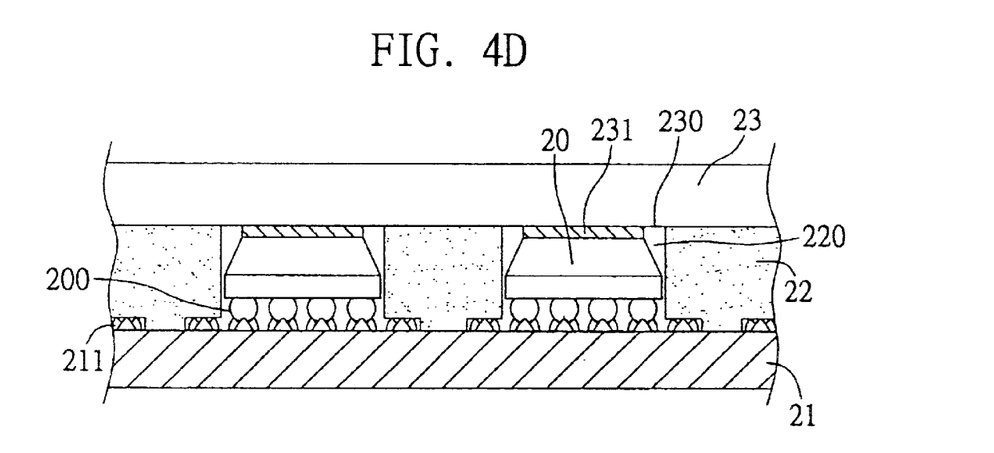

Referring finally to FIG. 4D, a covering member 23 is prepared and attached to the interposer 22, wherein the covering member 23 is formed on a surface 230 thereof with a plurality of elastic mechanisms 231 corresponding in position to the through holes 220 of the interposer 22. The covering member 23 is mounted on the interposer 22 in a manner as to face the elastic mechanisms 231 toward the interposer 22, allowing the semiconductor packages 20 received in the through holes 22 to be covered by the covering member 23. Then, by electrically connecting the circuit board 21 to a test device such as a test oven (not shown), the semiconductor packages 20 can be in turn electrically coupled to the test device through the circuit board 21, so as to allow the test device to perform various tests for testing functionality of the semiconductor packages 20. This therefore completes the test method of using the test fixture 2 of the invention.

The elastic mechanisms 231 formed on the covering member 23 are adapted to come into contact with the semiconductor packages 20 received in the through holes 220 of the interposer 22. By a resilient force provided from the elastic mechanisms 231, the semiconductor packages 20 are pressed toward the circuit board 21, and firmly electrically connected to the circuit board 21 in a manner as not to damage structure of the semiconductor packages 20. Each of the elastic mechanisms 231 is dimensioned for completely covering the corresponding semiconductor package 20, so as to allow the semiconductor package 20 to be evenly in contact with the circuit board 21. The elastic mechanisms 231 can be made of elastomer, springs and so on, nevertheless, other elastic means may also be suitably adopted for the test fixture 2 of the invention.

Figure 5:
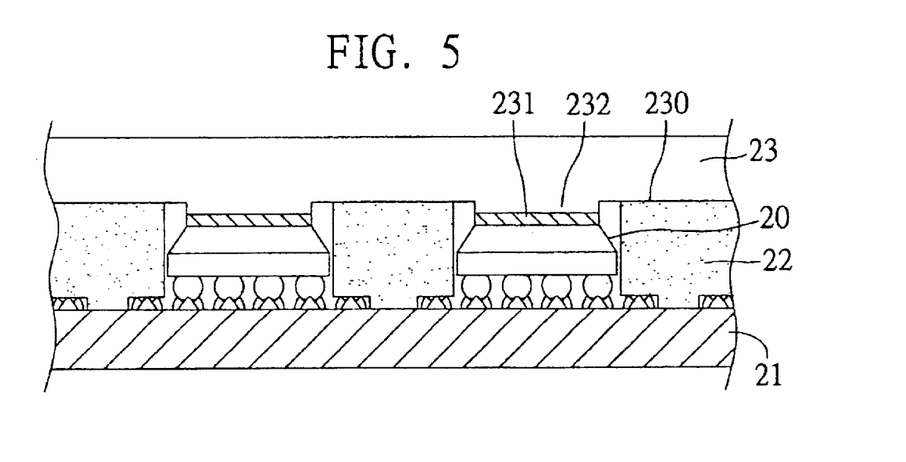
FIG. 5 is a cross-sectional view of another embodiment of the test fixture of the invention mounted with semiconductor packages.

In addition, as shown in FIG. 5, a plurality of protruding portions 232 can be formed on the surface 230 of the covering member 23 in a manner that, the protruding portions 232 are interposed between the surface 230 of the covering member 23 and the elastic mechanisms 231. Combination of the protruding portions 232 and the elastic mechanisms 231 further assures the semiconductor packages 20 to be in firm electrical contact with the circuit board 21, which favors the test performing for the semiconductor packages 20.

In conclusion, the test fixture of the invention provides significant benefits. First, the test fixture uses a replaceable interposer and a covering member with elastic mechanisms for firmly accommodating semiconductor packages in position, instead of costly and structurally complex sockets of the prior art, thereby making the test fixture relatively more cost-effectively fabricated by simplified processes. Moreover, the test fixture of the invention can be applied to variously sized semiconductor packages by simply replacing an interposer with suitably dimensioned through holes for properly receiving the semiconductor packages therein; this therefore reduces process complexity and costs in fabrication of the test fixture. In addition, the elastic mechanisms formed on the covering member are used to press on semiconductor packages, allowing the semiconductor packages to be well electrically connected to a circuit board of the test fixture; and elastic properties of the elastic mechanisms would not damage structure of the semiconductor packages, thereby not undesirably deteriorating yield of package products.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A test fixture for semiconductor packages, for electrically connecting a plurality of semiconductor packages to a test device where tests are performed, the test fixture comprising:

a circuit board for accommodating the plurality of semiconductor packages thereon, and for electrically connecting the semiconductor packages to the test device;

an interposer detachably mounted on the circuit board, and formed with a plurality of through holes that penetrate through the interposer, so as to allow the semiconductor packages to be received in the through holes; and a covering member mounted on the interposer and for covering the semiconductor packages received in the through holes of the interposer, wherein the covering member is formed on a surface thereof with a plurality of elastic mechanisms corresponding in position to the through holes in a manner that the elastic mechanisms are adapted to abut against the semiconductor packages and provide a resilient force as to allow the semiconductor packages to be firmly in contact with the circuit board, and a plurality of protruding portions are further formed on a surface of the covering member corresponding in position to the elastic mechanisms in a manner that the protruding portions are interposed between the surface of the covering member and the elastic mechanisms.

2. The test fixture of claim 1, wherein the circuit board is formed with a plurality of contact mechanisms for coming into electrical contact with input/output connections of the semiconductor packages.

3. The test fixture of claim 2, wherein, the input/output connections are solder balls.

4. The test fixture of claim 1, wherein the interposer is made of an insulating material.

5. The test fixture of claim 1, wherein the interposer is dimensioned in a manner as to allow the semiconductor packages to be completely received in the through holes.

6. The test fixture of claim 1, wherein each of the elastic mechanisms is dimensioned in a manner as to completely cover the corresponding semiconductor package, so as to allow the semiconductor package to be evenly in contact with the circuit board by means of the resilient force provided from the elastic mechanism.

7. A test method of using a test fixture for semiconductor packages, allowing a plurality of semiconductor packages to be electrically connected to a test device by the test fixture, so as to perform tests for the semiconductor packages through the use of the test device, the test method comprising the steps of:

preparing a circuit board;

mounting an interposer on the circuit board, the interposer being formed with a plurality of through holes that penetrate through the interposer;

disposing the plurality of semiconductor packages respectively in the through holes of the interposer, allowing the semiconductor packages to be accommodated on and electrically connected to the circuit board;

attaching a covering member to the interposer, for covering the semiconductor packages received in the through holes of the interposer, wherein the covering member is formed on a surface thereof with a plurality of elastic mechanisms corresponding in position to the through holes in a manner that the elastic mechanisms are adapted to abut against the semiconductor packages and provide a resilient force as to allow the semiconductor packages to be firmly in contact with the circuit board, and a plurality of protruding portions are further formed on a surface of the covering member corresponding in position to the elastic mechanisms in a manner that the protruding portions are interposed between the surface of the covering member and the elastic mechanisms; and electrically connecting the circuit board to the test device, so as to allow the semiconductor packages to be electrically connected to the test device where tests are performed.

8. The test method of claim 7, wherein the circuit board is formed with a plurality of contact mechanisms for coming into electrical contact with input/output connections of the semiconductor packages.

9. The test method of claim 8, wherein the input/output connections are solder balls.

10. The test method of claim 7, wherein the interposer is made of an insulating material.

11. The test method of claim 7, wherein the interposer is dimensioned in a manner as to allow the semiconductor packages to be completely received in the through holes.

12. The test method of claim 7, wherein each of the elastic mechanisms is dimensioned in a manner as to completely cover the corresponding semiconductor package, so as to allow the semiconductor package to be evenly in contact with the circuit board by means of the resilient force provided from the elastic mechanism.

* * * * *